United States Patent
Sorensen

(10) Patent No.: US 9,633,672 B1
(45) Date of Patent: Apr. 25, 2017

(54) METHOD AND DEVICE FOR SUPPRESSING AMBIENT NOISE IN A SPEECH SIGNAL GENERATED AT A MICROPHONE OF THE DEVICE

(71) Applicant: BLACKBERRY LIMITED, Waterloo (CA)

(72) Inventor: Tommy Sorensen, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 0 days.

(21) Appl. No.: 14/926,688

(22) Filed: Oct. 29, 2015

(51) Int. Cl.
| | |
|---|---|
| H04B 15/00 | (2006.01) |
| H04R 3/00 | (2006.01) |
| G10L 21/0232 | (2013.01) |
| H04R 3/04 | (2006.01) |
| H03G 3/30 | (2006.01) |
| H04R 29/00 | (2006.01) |
| G10L 21/0224 | (2013.01) |
| G01P 15/09 | (2006.01) |

(52) U.S. Cl.
CPC .......... G10L 21/0232 (2013.01); G01P 15/09 (2013.01); G10L 21/0224 (2013.01); H03G 3/3005 (2013.01); H04R 3/04 (2013.01); H04R 29/004 (2013.01); H04R 2499/11 (2013.01)

(58) Field of Classification Search
CPC .. A63J 5/04; A63J 25/00; H03F 3/181; H04R 1/1083; H04R 1/403; H04R 3/12; H04R 5/023; H04R 27/00; H04R 2420/03; H04S 5/00; H04S 7/30; H04S 2400/11; H04W 4/02; H04W 4/043
See application file for complete search history.

(56) References Cited

U.S. PATENT DOCUMENTS

| | | | |
|---|---|---|---|
| 2009/0103744 A1 | 4/2009 | Klinghult et al. | |
| 2010/0022269 A1 | 1/2010 | Terlizzi | |
| 2013/0196715 A1 | 8/2013 | Hansson et al. | |
| 2013/0208923 A1* | 8/2013 | Suvanto | H04R 3/005 381/122 |
| 2014/0072148 A1* | 3/2014 | Smith | H04R 1/08 381/151 |
| 2014/0093091 A1 | 4/2014 | Dusan et al. | |

OTHER PUBLICATIONS

Levinzon, Felix A., IEEE, "Fundamental Noise Limit of Piezoelectric Accelerometer", IEEE Sensors Journal, vol. 4, No. 1, Feb. 2004.

* cited by examiner

*Primary Examiner* — Muhammad N Edun
(74) *Attorney, Agent, or Firm* — Perry + Currier, Inc.

(57) ABSTRACT

The present disclosure relates to a mobile communication device and a method of controlling a mobile communication device to suppress ambient noise in a speech signal generated at a microphone of the mobile communication device. A primary microphone configured to receive speech and ambient noise and generate a primary speech signal corresponding to the speech and the ambient noise that is received. An accelerometer configured to detect vibrations of the mobile communication device when the speech and the ambient noise are received at the microphone and to generate a signal corresponding to the vibrations that are detected. A processor is operably coupled to the microphone and the accelerometer and configured to generate, using signal processing, a noise suppressed speech signal based on the primary speech signal and the signal received from the accelerometer.

16 Claims, 6 Drawing Sheets

METHOD AND DEVICE FOR SUPPRESSING AMBIENT NOISE IN A SPEECH SIGNAL GENERATED AT A MICROPHONE OF THE DEVICE

FIELD

The present disclosure relates generally to mobile communication devices and specifically to a method of controlling a mobile communication device to suppress non-stationary or ambient noise in a speech signal generated at a microphone of the mobile communication device.

BACKGROUND

In mobile communication devices that include two microphones, non-stationary or ambient noise may be suppressed by positioning the two microphones of the mobile communication device at a predetermined distance from one another. For example, a primary microphone of the mobile communication device may be located proximate to a bottom end of the mobile communication device so that the primary microphone is as close to a mouth of a user when the mobile communication device is used by the user. A secondary microphone of the mobile communication device may be located on a back surface of the mobile communication device to achieve a predetermined amount of natural dampening in speech received at the primary microphone when the mobile communication device is used by a user. This two microphone configuration results in speech received at the primary microphone being significantly louder than speech received at the secondary microphone when a user speaks directly into the primary microphone. Known non-stationary noise suppression processes, such as those based on beam forming principles, may be utilized to suppress non-stationary or ambient noise received in a speech signal generated at the primary microphone while keeping the generated speech signal intact. Such known non-stationary noise suppression processes, however, have limitations. For example, when a primary microphone and a secondary microphones of a mobile communication device receive speech from a user that has the same level, known non-stationary noise suppression processes treat the speech signal generated at the primary microphone as ambient noise and hence attempt to suppress this speech signal, which causes unwanted muting of the speech signal generated at the primary microphone. Improvements in non-stationary or ambient noise suppression process are therefore desirable.

BRIEF DESCRIPTIONS OF THE DRAWINGS

For a better understanding of the various implementations described herein and to show more clearly how they may be carried into effect, reference will now be made, by way of example only, to the accompanying drawings in which.

Figure 1:
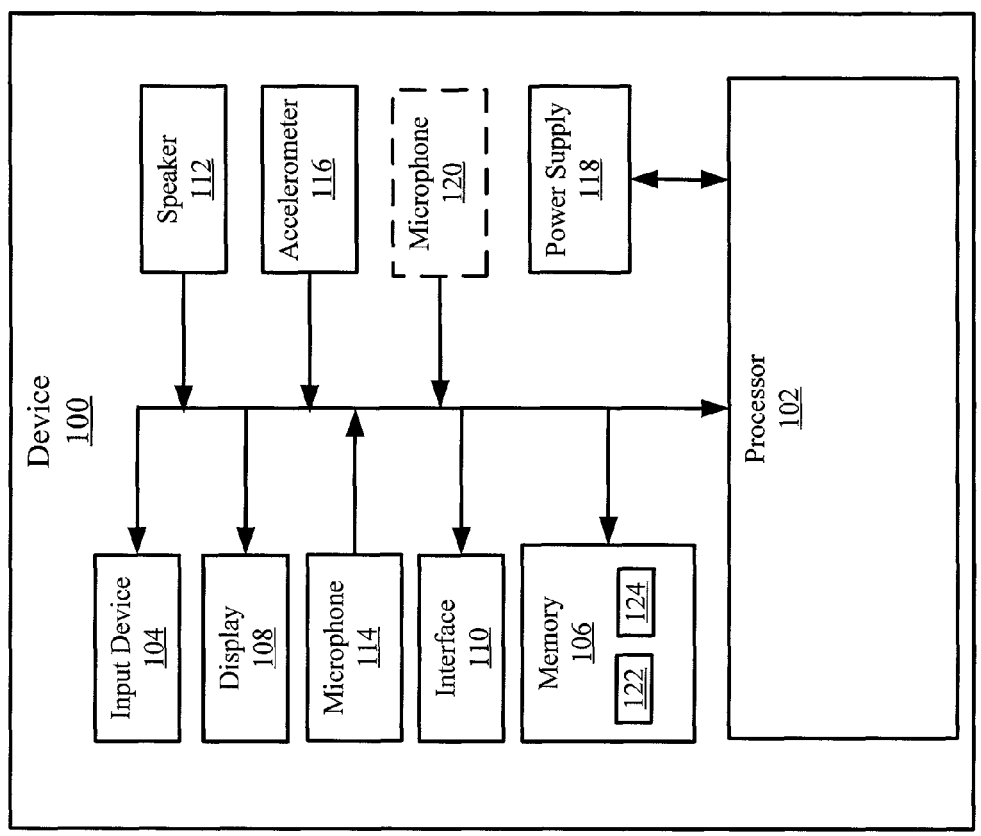
FIG. 1 is a block diagram of the mobile communication device in accordance with a non-limiting implementation of the disclosure.
Figure 5A:
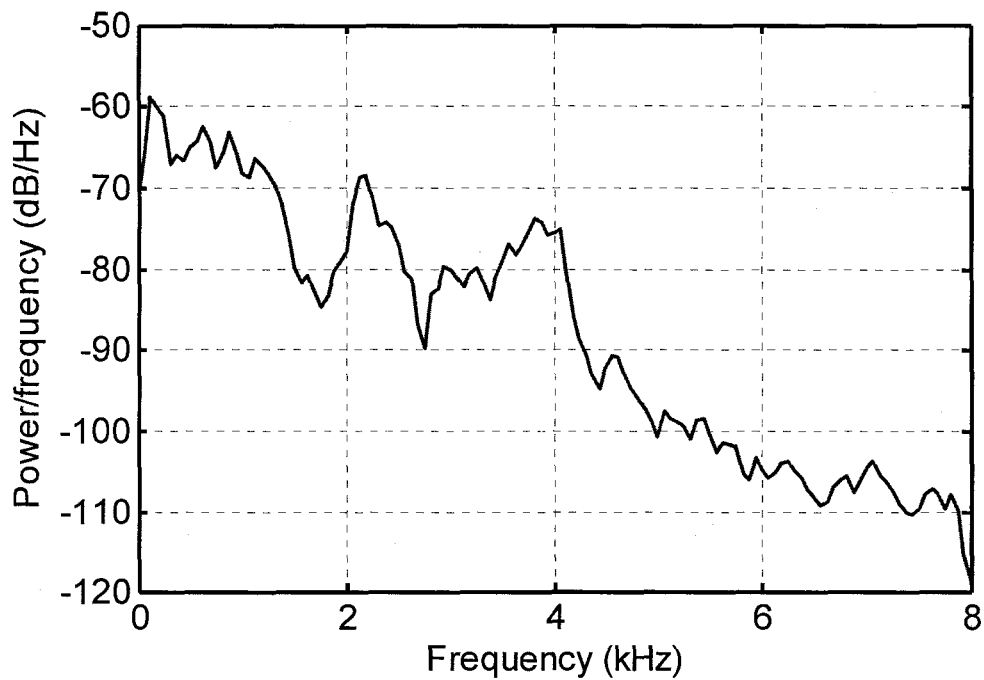
Figure 5B:
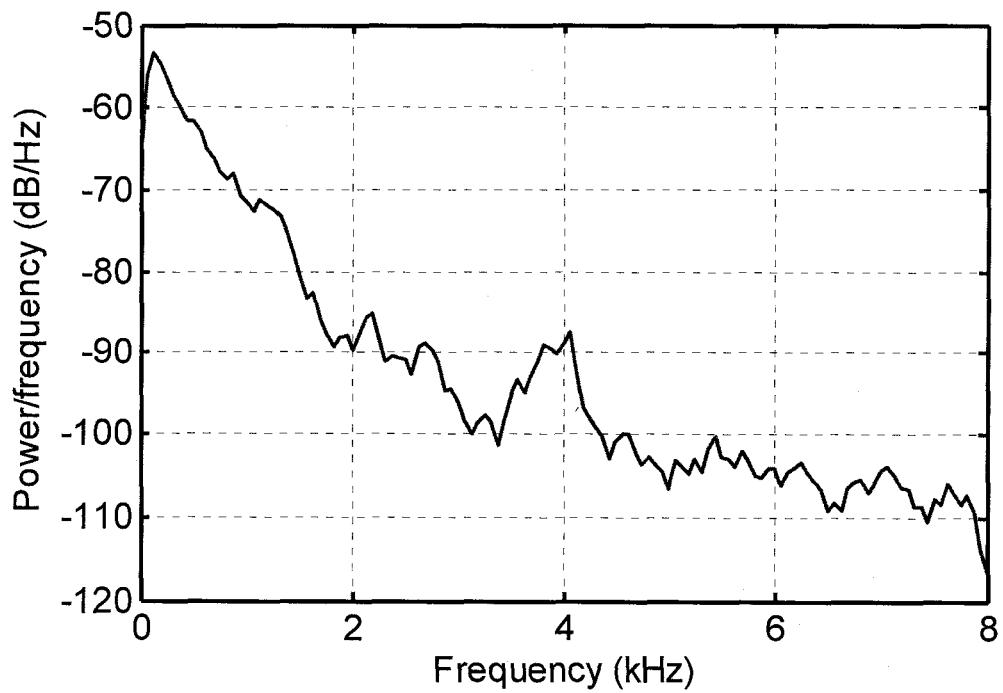
Figure 6:
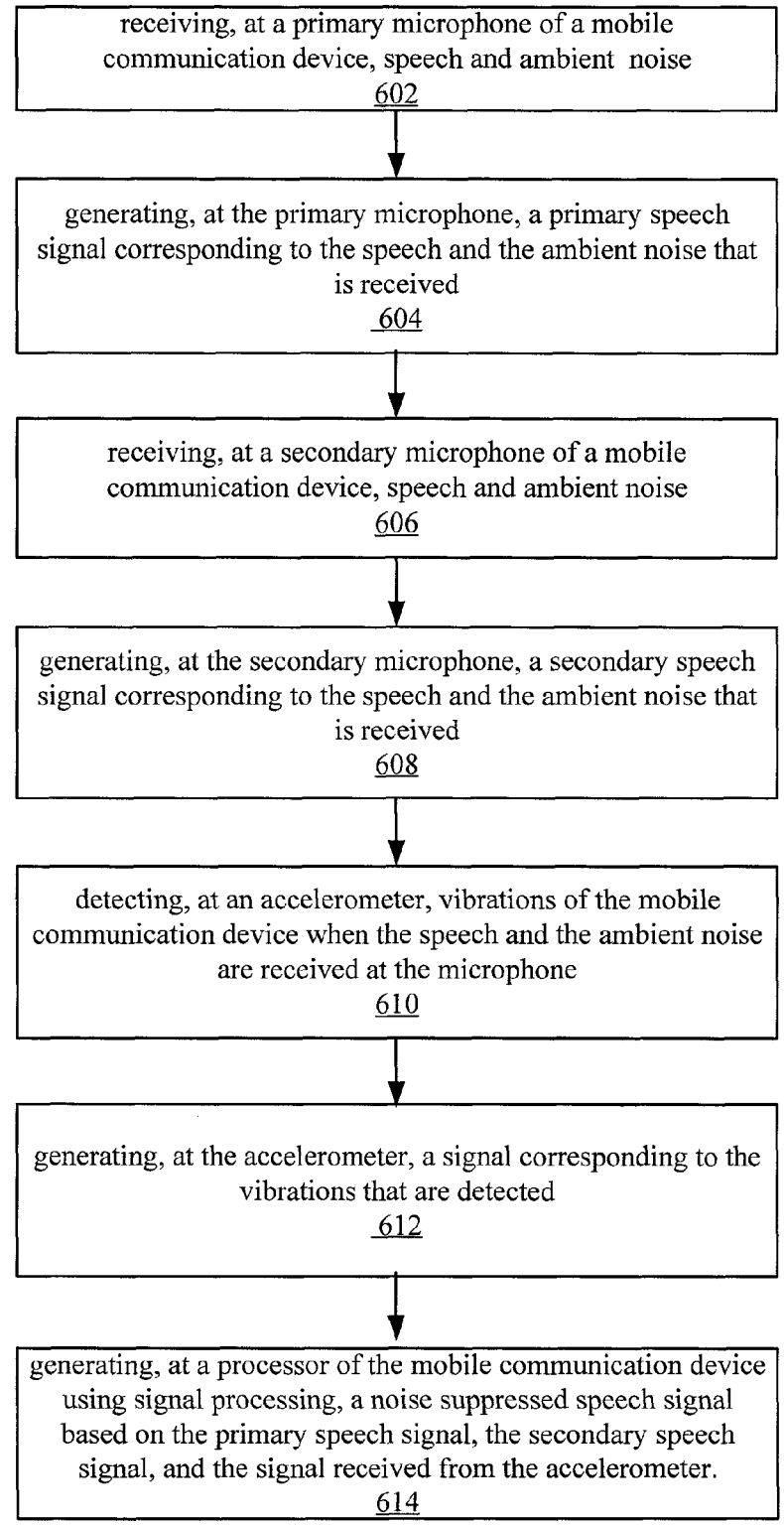

FIG. 5A is a graph that depicts the frequency spectrum of the primary speech signal generated at the primary microphone of the mobile communication device of FIG. 1 in accordance with a non-limiting implementation of the disclosure; FIG. 5B is a graph that depicts the frequency spectrum of the primary speech signal of FIG. 5A after non-stationary or ambient noise is suppressed from the primary speech signal in accordance with a non-limiting implementation of the disclosure;

FIG. 6 is a flowchart depicting a method of suppressing ambient noise in a primary speech signal generated at a primary microphone of the mobile communication device of FIG. 1 in accordance with another non-limiting implementation of the disclosure.

DETAILED DESCRIPTION

The following describes a mobile communication device and a method of controlling a mobile communication device to suppress non-stationary or ambient noise from a primary speech signal generated at a primary microphone of a mobile communication device.

In the present disclosure, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this disclosure, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

In the present disclosure, reference is made to a microphone generating a speech signal. In general, it is appreciated that such speech signal can be converted to speech data, and hence the feature of a microphone generating a speech signal can be interchangeably replaced with the term a microphone generating a speech data. The speech data may be stored in a memory of the mobile communication device and may be processed by a processor of the mobile communication device.

An aspect of the present disclosure provides a mobile communication device comprising: a primary microphone configured to receive speech and ambient noise and generate a primary speech signal corresponding to the speech and the ambient noise that is received; an accelerometer configured to detect vibrations of the mobile communication device when the speech and the ambient noise are received at the microphone and to generate a signal corresponding to the vibrations that are detected; and, a processor operably coupled to the microphone and the accelerometer, the processor configured to: generate, using signal processing, a noise suppressed speech signal based on the primary speech signal and the signal received from the accelerometer.

The body may have a top wall and an opposing bottom wall and the primary microphone may be disposed in the body proximate the bottom wall.

The accelerometer may be disposed in the body to detect vibrations at a front surface of the body.

The accelerometer may disposed in the body to detect vibrations at a back surface of the body.

The accelerometer may be a piezoelectric accelerometer, a low-impedance output accelerometer, or a micro-electromechanical system (MEMS).

The processor may be further configured to generate, using signal processing, the noise.

The mobile communication device may also include a secondary microphone configured to receive speech and ambient noise and generate a secondary speech signal corresponding to the speech and the ambient noise that is received.

The processor may be operably coupled to the secondary microphone and further configured to: generate, using signal processing, the noise suppressed speech signal based on the primary speech signal, and the signal received from the accelerometer, and the secondary speech signal received from the secondary microphone.

The processor may be configured to generate, using signal processing, the noise suppressed speech signal by: transforming the primary speech signal into a frequency domain primary speech signal; transforming the signal received from the accelerometer into a frequency domain signal; cross-correlating the frequency domain primary speech signal with the frequency domain signal; identifying regions in the frequency domain primary speech signal where a strong cross-correlation exists between the frequency primary speech signal and the frequency domain signal; suppressing the identified regions in the frequency domain primary speech signal; and, generating the noise suppressed speech signal by transforming the frequency domain primary speech signal to a time domain primary speech signal.

The processor may be configured to generate, using signal processing, the noise suppressed speech signal by: cross-correlating, in a time domain, the primary speech signal received from primary microphone with the signal received from the accelerometer; identifying portions in the primary speech signal where a strong cross-correlation exists between the primary speech signal and the signal received from the accelerometer; and, generating the noise suppressed speech signal by reducing an amplitude in the identified portions of the primary speech signal.

Another aspect of the present disclosure provides a method comprising: at a mobile communication device comprising, a primary microphone, an accelerometer, and a processor, receiving, at the primary microphone, speech and ambient noise; generating, at the primary microphone, a primary speech signal based on the speech and the ambient noise that is received; detecting, at the accelerometer, vibrations of the mobile communication device when the speech and the ambient noise are received at the microphone; generate, at the accelerometer, a signal corresponding to the vibrations that are detected; and, generating, at the processor, using signal processing, a noise suppressed speech signal based on the primary speech signal and the signal received from the accelerometer.

Detecting, at the accelerometer, vibrations at the mobile communication device when the speech and the ambient noise are received at the microphone may include detecting vibrations at a front surface of the mobile communication device or detecting vibrations at a back surface of the mobile communication device.

The accelerometer may be a piezoelectric accelerometer, a low-impedance output accelerometer, or a micro-electromechanical system (MEMS).

Generating, at the processor using signal processing may include generating the noise suppressed speech signal at frequencies spanning from 0.001 kHz to 10 kHz.

The method may also include receiving, at a secondary microphone of the mobile communication device, speech and ambient noise; generating, at the secondary microphone, a secondary speech signal corresponding to the speech and the ambient noise that is received.

Generating, using signal processing, the noise suppressed speech signal may include generating, using signal processing the noise suppressed signal based on the primary speech signal, and the signal received from the accelerometer, and the secondary speech signal received from the secondary microphone.

Generating at the processor using signal processing, the noise suppressed speech signal may include: transforming the primary speech signal into a frequency domain primary speech signal; transforming the signal received from the accelerometer into a frequency domain signal; cross-correlating the frequency domain primary speech signal with the frequency domain signal; identifying regions in the frequency domain primary speech signal where a strong cross-correlation exists between the frequency primary speech signal and the frequency domain signal; suppressing the identified regions in the frequency domain primary speech signal; and, generating the noise suppressed speech signal by transforming the frequency domain primary speech signal to a time domain primary speech signal.

Generating, at the processor using signal processing, the noise suppressed speech signal may include: cross-correlating, in a time domain, the primary speech signal received from primary microphone with the signal received from the accelerometer; identifying portions in the primary speech signal where a strong cross-correlation exists between the primary speech signal and the signal received from the accelerometer; and, generating the noise suppressed speech signal by reducing an amplitude in the identified portions of the primary speech signal.

Another aspect of the present disclosure a non-transitory, tangible machine readable storage medium encoded with machine executable instructions, wherein execution of the machine executable instructions is for a mobile communication device to: receive, at a primary microphone of the mobile communication device, speech and ambient noise; generate, at the primary microphone, a primary speech signal based on the speech and the ambient noise that is received; detect, at an accelerometer of the mobile communication device, vibrations at the mobile communication device when the speech and the ambient noise are received at the microphone; generate, at the accelerometer, a signal corresponding to the vibrations that are detected; and, generate, using signal processing, a noise suppressed speech signal based on the primary speech signal and the signal received from the accelerometer.

For simplicity and clarity of illustration, reference numerals may be repeated among the figures to indicate corresponding or analogous elements. Numerous details are set forth to provide an understanding of the implementations described herein. The implementations may be practiced without these details. In other instances, well-known methods, procedures, and components have not been described in detail to avoid obscuring the implementations described. The present disclosure is not to be considered as limited to the scope of the implementations described herein.

Attention is directed to FIG. 1, which depicts a block diagram of a mobile communication device 100, referred to interchangeably hereafter as device 100, according to an example implementation of the disclosure.

Device 100 may be any type of electronic device that can be used in a self-contained manner to communicate with one or more communication networks. Device 100 may include, but is not limited to, any suitable combination of electronic devices, communications devices, computing devices, mobile electronic devices, telephones, PDAs (personal digital assistants), cellphones, smartphones, and the like. Other suitable devices are within the scope of present implementations.

Figure 2:
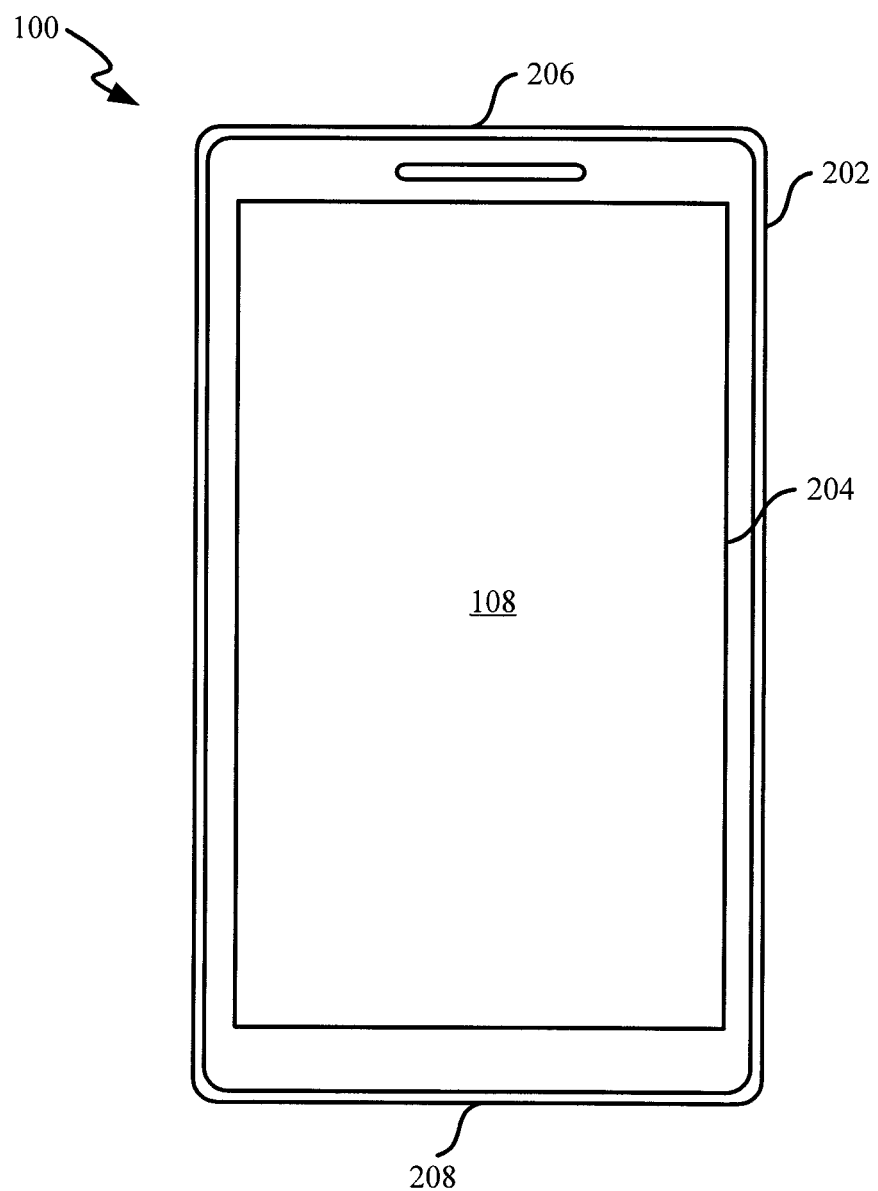
FIG. 2 is a front view of a mobile communication device of FIG. 1 in accordance with a non-limiting implementation of the disclosure.

It should be emphasized that the shape and structure of device 100 in FIG. 1 and FIG. 2 are purely examples, and contemplate a device that may be used for both wireless voice (e.g. telephony) and wireless data communications (e.g. email, web browsing, text, and the like).

Device 100 includes multiple components, such as a processor 102 that controls the overall operation of device 100. Processor 102 is coupled to and interacts with other components of device 100, including at least one input device 104, a memory 106, a display 108, a communication interface 110, a speaker 112, a primary microphone 114, an accelerometer 116, and a power supply 118. Optionally, processor 102 is also coupled to and interacts with a secondary microphone 120.

Input device 104 is generally configured to receive input data, and may include any suitable combination of input devices, including but not limited to a keyboard, a keypad, a pointing device, a mouse, a track wheel, a trackball, a touchpad, a touchscreen and the like. Other suitable input devices are within the scope of present implementations.

Input from input device 104 is received at processor 102. Processor 102 may be implemented as a plurality of processors, and/or as one or more DSPs (Digital Signal Processors) including but not limited to one or more central processors (CPUs)). Processor 102 is configured to communicate with memory 106 comprising a non-volatile storage unit (e.g. Erasable Electronic Programmable Read Only Memory ("EEPROM"), Flash Memory) and a volatile storage unit (e.g. random access memory ("RAM")). Programming instructions that implement the functional teachings of device 100 as described herein are typically maintained, persistently, in memory 106 and used by processor 102 which makes appropriate utilization of volatile storage during the execution of such programming instructions. Those skilled in the art will now recognize that memory 106 is an example of computer readable media that can store programming instructions executable on processor 102. Furthermore, memory 106 is also an example of a memory unit and/or memory device.

Device 100 also includes an operating system 122 and software programs or applications 124 that control basic device operations, including data and voice communication applications. Operating system 122 and the software programs or applications 124 are normally installed on the device 100 at manufacture and are typically stored in memory 106. Operating system 122 and the software programs or applications 124 are executed by the processor 102. Those skilled in the art will appreciate that portions of operating system 122 and software programs or applications 123, such as specific device applications, or parts thereof, may be temporarily loaded into volatile storage unit of memory 106. Other software programs can also be included, as is well known to those skilled in the art.

Processor 102 is further configured to interact with display 108, which comprises any suitable one of, or combination of, flat panel displays (e.g. LCD (liquid crystal display), plasma displays, OLED (organic light emitting diode) displays, touch-sensitive displays such as capacitive, resistive, infrared, surface acoustic wave (SAW), optical touchscreen displays, CRTs (cathode ray tubes) and the like.

Processor 102 is further configured to interact with communication interface 110 (referred to interchangeably as interface 100), which may be implemented as one or more radios and/or network adaptors and/or connectors to radios or network adaptors, configured to wirelessly communicate with one or more communication networks (not depicted). It will be appreciated that interface 100 is configured to correspond with the network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+ such as UMTS (Universal Mobile Telecommunications System), GSM (Global System for Mobile Communications), CDMA (Code division multiple access), FDD (frequency division duplexing), LTE (Long Term Evolution), TDD (time division duplexing), TDD-LTE (TDD-Long Term Evolution), TD-SCDMA (Time Division Synchronous Code Division Multiple Access) and the like, wireless data, Bluetooth links, NFC (near field communication) links, WLAN (wireless local area network) links, Wi-Fi links, WiMax links, packet based links, the Internet, analog networks, the PSTN (public switched telephone network), access points, and the like, and/or a combination.

Processor 102 is further configured to interact with speaker 112 and primary microphone 114. Speaker 112 outputs audible converted from an electrical signal. Primary microphone 114 is configured to receive audible information, such as, for example, speech of a user of device 100 and non-stationary or ambient noise, and generate a signal that is representative of the received audible information. In other words, primary microphone 114 is configured to generate a signal that is representative of the non-stationary or ambient noise that is received. Primary microphone 114 is also configured to generate or convert the audible information that is received into a primary speech signal that is representative of the audible information that is received at primary microphone 114.

Processor 102 is further configured to interact with accelerometer 116. Accelerometer 116 is configured to detect vibrations of device 100 when audible information, such as speech and non-stationary or ambient noise is received at primary microphone 114. Accelerometer 116 is also configured to generate a signal corresponding to the vibrations that are detected and forward the signal to processor 102 for further processing. Accelerometer 116 may be any suitable device that includes piezoelectric, piezoresistive and/or capacitive components that measure vibrations at device 100 and convert the measured vibrations into an electrical signal. For example, accelerometer 116 may be a piezoelectric accelerometer, a low-impedance output accelerometer or a micro-electromechanical system (MEMS).

Processor 102 is further configured to interact with power supply 118. Power supply 118 powers components of device 100 including, but not limited to processor 102, input device 104, memory 106, display 108, interface 110, speaker 112, primary microphone 114, accelerometer 116, and optional secondary microphone 120. Power supply 118 may include, a battery, a power pack and the like; however, in other implementations, power supply 118 may include a connection to a mains power supply and/or a power adaptor (e.g. and AC-to-DC (alternating current to direct current) adaptor).

In an example implementation, device 100 may optionally include secondary microphone 120 and processor 102 may be configured to interact with secondary microphone 120. Secondary microphone 120 may be configured to receive audible information, such as, for example, speech of a user of device 100 and non-stationary or ambient noise, and generate a secondary speech signal that is representative of the audible information that is received at secondary microphone 120. Secondary microphone 120 may also be configured to generate or convert the audible information that is received into secondary speech signal that is representative of the audible information received at secondary microphone 120.

Attention is now directed to FIG. 2, which depicts a front view of an example implementation of device 100. Device 100 includes a body 202 that includes a front face 204 a top wall 206, a bottom wall 208, and a back surface 210 when device 100 is orientated for use. Display 108 is disposed in body 202 and exposed at front face 204 for user-interaction. Speaker 112 is disposed in a receiver cavity 210 formed in body 202. Receiver cavity 210 is disposed in body 202, proximate top wall 206 and exposed at front face 204 of device 100. Primary microphone 114 is disposed in body 202, proximate bottom wall 208 and receives audible information such as, for example, speech from a user and non-stationary or ambient noise from a surrounding environment when device 100 is being used by a user. Although primary microphone 114 is shown in FIG. 2 proximate bottom wall 208, in alternate non-limiting implementations, primary microphone 114 may be disposed in body 202 at any suitable location such that primary microphone 114 receives both speech and non-stationary or ambient noise when device 100 is being used by a user.

Accelerometer 116 is also disposed in body 202 at any suitable location so that accelerometer 116 may detect vibrations at device 100 when primary microphone 114 receives audible information, such as speech from a user and non-stationary or ambient noise from a surrounding environment of device 100. For example, accelerometer 116 may be disposed in body 202 so that accelerometer 116 detects vibrations at front face 204 of body 202 of device 100. Alternatively, accelerometer 116 may be disposed in body 202 so that accelerometer 116 detects vibrations at back surface 210 of device 100.

In an alternate implementation, device 100 may optionally include secondary microphone 120 in addition to primary microphone 114 and accelerometer 116. Secondary microphone 120 may be disposed in body 202 proximate top wall 206 of body 202 such that secondary microphone 120 receives audible information, such as, for example, speech from a user and non-stationary or ambient noise from the surrounding environment of device 100 when device 100 is used by a user. Although secondary microphone 120 is shown proximate top wall 206, in alternate non-limiting implementations, secondary microphone 120 may be disposed in body 202 at any suitable location such that secondary microphone 116 receives both speech and non-stationary or ambient noise when device 100 is being used by a user.

Figure 3:
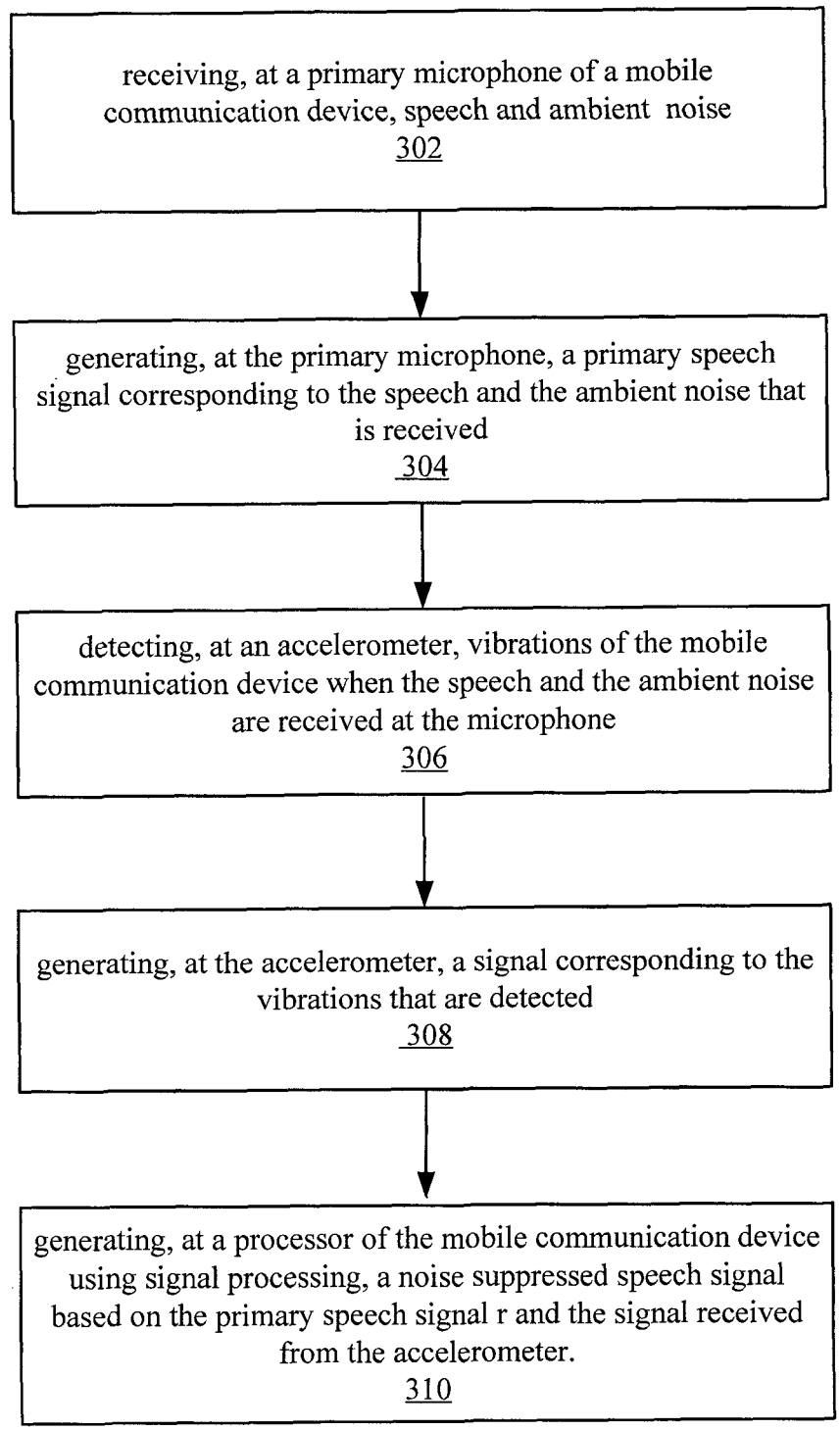
FIG. 3 is a flowchart depicting a method of suppressing ambient noise in a primary speech signal generated at a primary microphone of the mobile communication device of FIG. 1 in accordance with a non-limiting implementation of the disclosure.

Attention is now directed to FIG. 3, which depicts a flowchart of a method 300 for controlling a mobile communication device to suppress non-stationary or ambient noise in audible information received at primary microphone 114 of device 100, according to an example implementation.

Method 300 may be carried out by software executed, for example, by processor 102 of device 100. Coding of software for carrying out method 300 is within the scope of a person of ordinary skill in the art given the present disclosure. Computer-readable code executable by at least one processor 102 of device 100 to perform method 300 may be stored in a computer-readable storage medium, device, or apparatus, such as a non-transitory computer-readable medium.

It is to be emphasized, that method 300 need not be performed in the exact sequence as shown, unless otherwise indicated; and likewise various blocks may be performed in parallel rather than in sequence; hence the elements of method 300 are referred to herein as "blocks" rather than "steps".

At block 302, primary microphone 114 of device 100 receives audible information from a user. The audible information includes speech spoken by a user of device 100 and non-station noise from a surrounding environment of device 100.

At block 304, primary microphone 114 generates a primary speech signal corresponding to the audible information (i.e., the speech and the non-stationary or ambient noise) that is received at block 302. The primary speech signal has a frequency span or range from approximately 0 kHz to 4 kHz.

At block 306, accelerometer 116 of device 100 detects vibrations at device 100 when the audible information (i.e., the speech and the non-stationary or ambient noise) is received at primary microphone 114.

At block 308, accelerometer 116 generates a signal corresponding to the vibrations that are detected and sends the signal to processor 102.

At block 310, processor 102 receives the primary speech signal from primary microphone 114 and the signal from accelerometer 116 and generates, using signal processing, a noise suppressed speech signal based on the speech signal that is received from primary microphone 114 and the signal received from accelerometer 116.

In an example implementation, processor 102 generates, using signal processing the noise suppressed speech signal by: (1) transforming the primary speech signal into a frequency domain primary speech signal; (2) transforming the signal received from accelerometer 116 into a frequency domain signal; (3) cross-correlating the frequency domain primary speech signal with the frequency domain signal; (4) identifying regions in the frequency domain primary speech signal where a strong cross-correlation exists between the frequency primary speech signal and the frequency domain signal; (5) de-emphasizing or suppressing the identified regions in the frequency domain primary speech signal; and (6) generating the noise suppressed speech signal by transforming the frequency domain primary speech signal to the time domain.

In another example implementation, processor 102 generates, using signal processing, the noise suppressed speech signal by: (1) cross-correlating, in the time domain, the primary speech signal received from primary microphone 114 with the signal received from accelerometer 116; (2) identifying portions in the primary speech signal where a strong cross-correlation exists between the primary speech signal and the signal corresponding to the vibrations that are detected at accelerometer 116; and (3) generating the noise suppressed speech signal by reducing an amplitude in the identified portions of the primary speech signal.

It will be appreciated that the noise suppressed speech signal can be generated by processor 102 using other suitable signal processing processes and/or methods, and specifically other suitable signal processing processes or methods that can be modified to receive the signal output from accelerometer 116 as input to produce the noise suppressed speech signal. For example, signal processing processes and/or methods can be modified to accept the signal corresponding to the vibrations output from accelerometer 116 as an indication of non-stationary or ambient noise.

Figure 4:
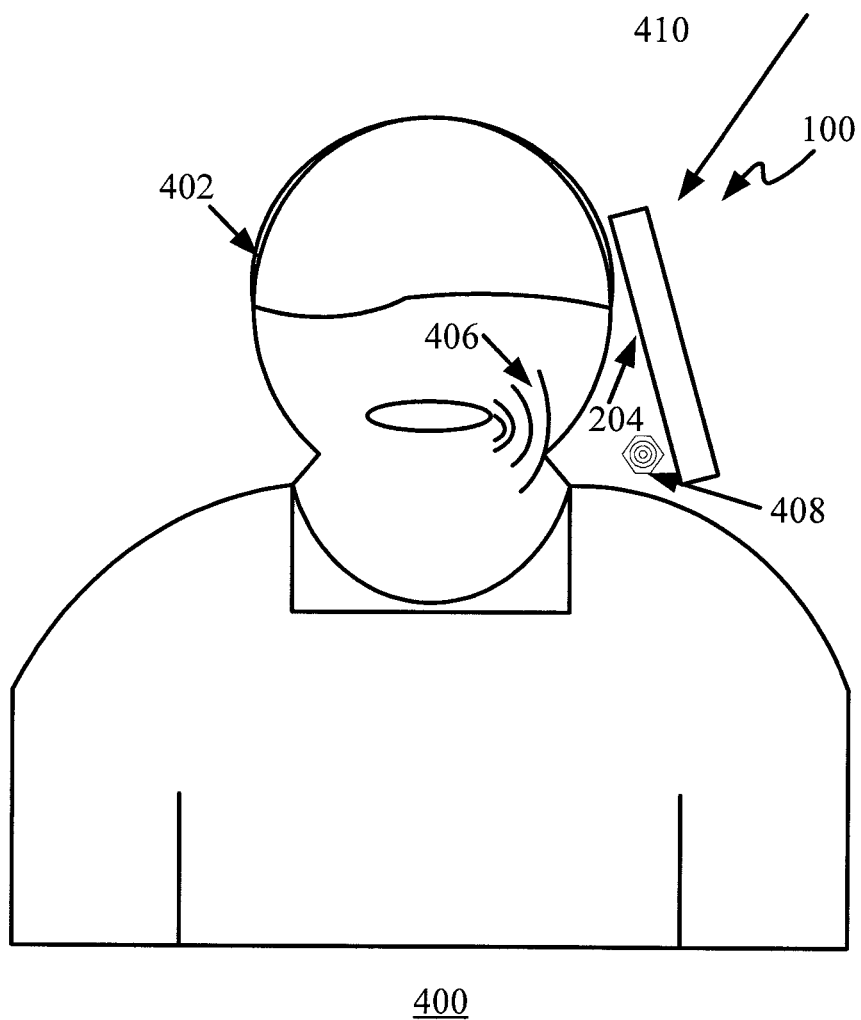
FIG. 4 is a perspective view of the mobile communication device of FIG. 1 when being used by a user in accordance with a non-limiting implementation of the disclosure.

Method 300 will now be discussed with reference to FIG. 4, which depicts device 100 being used by a user 400 in accordance with an example implementation. As shown in FIG. 4, when device 100 is being used by user 400, front face 208 of device 100 is adjacent to a head 402 of user 400. Primary microphone 114, which is, in the example implementation shown in FIG. 4, disposed in body 202 proximate bottom wall 208 of device 100 is exposed to receive audible information 406 that includes both speech from user 402 and non-stationary or ambient noise from the surrounding environment in which device 100 is used. Accelerometer 116 is configured to detect vibrations at device 100 when audible information 406 is received at primary microphone 114.

Primary microphone 114 receives, at block 302, audible information 406 that includes both speech from user 402 and non-stationary or ambient noise from the surrounding environment and generates, at block 304, a primary speech signal corresponding to the audible information 406 that is received at block 302.

At block 306, accelerometer 116 detects vibrations at device 100 when the audible information 406 (i.e., the speech and the non-stationary or ambient noise) is received at primary microphone 114.

At block 308, accelerometer 116 generates a signal corresponding to the vibrations that are detected.

At block 310, processor 102 receives the primary speech signal generated at block 302 and the signal generated at block 308 and generates, using signal processing, a noise suppressed speech signal, based on the primary speech signal received from primary microphone 114 and the signal received from accelerometer 116.

Attention is now directed to FIGS. 5A and 5B, in which FIG. 5A depicts the frequency spectrum of the primary speech signal generated at primary microphone 114 at block 302 according to an example implementation; and FIG. 5B depicts the frequency spectrum of the generated noise suppressed speech signal after signal processing the primary speech signal by processor 102 at block 310 according to an example implementation. In the example implementation depicted in FIG. 5B, non-stationary or ambient noise has been suppressed from the primary speech signal in frequency regions where accelerometer 116 has detected vibrations at device 100.

Attention is now directed to FIG. 6, which depicts a flowchart of a method 600 for controlling a mobile communication device to suppress non-stationary or ambient noise in audible information received at primary microphone 114 of device 100, according to an example implementation. Method 600 may be carried out by software executed, for example, by processor 102 of device 100. Coding of software for carrying out method 600 is within the scope of a person of ordinary skill in the art given the present disclosure. Computer-readable code executable by at least one processor 102 of device 100 to perform method 600 may be stored in a computer-readable storage medium, device, or apparatus, such as a non-transitory computer-readable medium.

It is to be emphasized, that method 600 need not be performed in the exact sequence as shown, unless otherwise indicated; and likewise various blocks may be performed in parallel rather than in sequence; hence the elements of method6 are referred to herein as "blocks" rather than "steps".

At block 602, primary microphone 114 of device 100 receives audible information from a user. The audible information includes speech spoken by a user of device 100 and non-station noise from a surrounding environment of device 100.

At block 604, primary microphone 114 generates a primary speech signal corresponding to the audible information (i.e., the speech and the non-stationary or ambient noise) that is received at block 602. The primary speech signal has a frequency span or range from approximately 0 kHz to 4 kHz.

At block 606, secondary microphone 120 of device 100 also receives audible information from a user. The audible information includes speech spoken by a user of device 100 and non-station noise from a surrounding environment of device 100.

At block 608, secondary microphone 120 generates a secondary speech signal corresponding to the audible information (i.e., the speech and the non-stationary or ambient noise) that is received at block 606. The secondary speech signal has a frequency span or range from approximately 0 kHz to 4 kHz.

At block 610, accelerometer 116 of device 100 detects vibrations at device 100 when the audible information (i.e., the speech and the non-stationary or ambient noise) is received at primary microphone 114 and at secondary microphone 120.

At block 612, accelerometer 116 generates an electrical signal corresponding to the vibrations that are detected and sends the electrical signal to processor 102.

At block 614, processor 102 receives the primary speech signal from primary microphone 114, the secondary speech signal from primary microphone 120, and the electrical signal from accelerometer 116 and generates, using signal processing, a noise suppressed speech signal based on the speech signal that is received from primary microphone 114 and the signal received from accelerometer 116.

The method and device of the present disclosure suppresses non-stationary or ambient noise in a primary signal generated at a primary microphone of a mobile communication device without removing any desired speech in the primary speech signal generated at the primary microphone of the mobile communication device.

In an alternative non-limiting implementation, when device 100 includes optional secondary microphone 120 and device 100 is placed adjacent to a head of a user, as shown in FIG. 4, secondary microphone 120 may receive audible information that includes attenuated speech because head 402 of user 400 shields or protects secondary microphone 120 from ambient or non-stationary noise when device is placed against an ear (not shown) of user 400. In this non-limiting implementation, secondary microphone 120 generates a secondary speech signal corresponding to the attenuated speech that is received at secondary microphone 120. Processor 102 receives, in addition to the primary speech signal from primary microphone 114 and the signal from accelerometer 116, the secondary speech signal from secondary microphone 120 and generates the noise suppressed speech signal, using signal processing, based on the primary speech signal received from primary microphone 114, the signal received from accelerometer 116, and the secondary speech signal from secondary microphone 120.

Those skilled in the art will appreciate that in some implementations, the functionality of device 100 can be implemented using pre-programmed hardware or firmware elements (e.g., application specific integrated circuits (ASICs), electrically erasable programmable read-only memories (EEPROMs), etc.), or other related components. In other implementations, the functionality of device 100 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, the computer-readable program can be stored as a computer program product comprising a computer usable medium. Further, a persistent storage device can comprise the computer readable program code. The computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A mobile communication device comprising:
  a primary microphone configured to receive speech and ambient noise and generate a primary speech signal corresponding to the speech and the ambient noise that is received;
  a secondary microphone configured to receive speech and ambient noise and generate a secondary speech signal corresponding to the speech and the ambient noise that is received;
  an accelerometer configured to detect vibrations at the mobile communication device when the speech and the ambient noise are received at the microphone and to generate an accelerometer signal corresponding to the vibrations that are detected; and,
  a processor operably coupled to the microphone and the accelerometer, the processor configured to:
    cross-correlate the primary speech signal with the accelerometer signal;
    identify regions in time where a strong cross-correlation exists between the primary speech signal and the accelerometer signal;
    determine whether a level of the primary speech signal and a level of the secondary speech signal are the same;
    when the level of the primary speech signal and a level of the secondary speech signal are the same, signal process, using a noise suppression process the accelerometer signal in the identified regions in time based on the secondary speech signal to generate a noise suppressed speech signal;
    otherwise, signal process, using the noise suppression process, the primary speech signal based on the secondary speech signal to generate the noise suppressed speech signal.

2. The mobile communication device of claim 1, further comprising a body having a top wall and an opposing bottom wall, and wherein the primary microphone is disposed in the body proximate the bottom wall.

3. The mobile communication device of claim 2, wherein the accelerometer is disposed in the body to detect vibrations at a front surface of the body.

4. The mobile communication device of claim 2, wherein the accelerometer is disposed in the body to detect vibrations at a back surface of the body.

5. The mobile communication device of claim 1, wherein the accelerometer is one of a piezoelectric accelerometer, a low-impedance output accelerometer, or a micro-electromechanical system (MEMS).

6. The mobile communication device of claim 1, wherein the noise suppressed speech signal is generated at frequencies spanning from 0.001 kHz to 10 kHz.

7. The mobile communication device of claim 1, wherein processor is configured to:
  cross-correlate the primary speech signal with the accelerometer signal in a frequency domain.

8. The mobile communication device of claim 1, wherein the processor is configured to:
  cross-correlate cross-correlating the primary speech signal received from primary microphone with the accelerometer signal in a time domain.

9. A method comprising:
  at a mobile communication device comprising, a primary microphone, a secondary microphone, an accelerometer, and a processor,
  receiving, at the primary microphone, speech and ambient noise;
  generating, at the primary microphone, a primary speech signal based on the speech and the ambient noise that is received;
  receiving, at the secondary microphone, speech and ambient noise;
  generating, at the secondary microphone, a secondary speech signal based on the speech and the ambient noise that is received;
  detecting, at the accelerometer, vibrations at the mobile communication device when the speech and the ambient noise are received at the microphone;
  generating, at the accelerometer, an accelerometer signal corresponding to the vibrations that are detected;
  cross-correlating, at the processor, the primary speech signal with the accelerometer signal;
  identifying, at the processor, regions in time where a strong cross-correlation exists between the primary speech signal and the accelerometer signal;
  determining, at the processor, whether a level of the primary speech signal and a level of the secondary speech signal are the same;
  when the level of the primary speech signal and a level of the secondary speech signal are the same, signal processing, at the processor, using a noise suppression process, the accelerometer signal in the identified regions in time based on the secondary speech signal to generate a noise suppressed speech signal;

otherwise, signal processing, at the processor, using the noise suppression process, the primary speech signal based on the secondary speech signal to generate the noise suppressed speech signal.

10. The method of claim 9, wherein detecting, at the accelerometer, vibrations at the mobile communication device when the speech and the ambient noise are received at the microphone comprises detecting vibrations at a front surface of the mobile communication device.

11. The method of claim 9, wherein detecting, at the accelerometer, vibrations at the mobile communication device when the speech and the ambient noise are received at the microphone comprises detecting vibrations at a back surface of the mobile communication device.

12. The method of claim 9, wherein the accelerometer is one of a piezoelectric accelerometer, a low-impedance output accelerometer, or a micro-electromechanical system (MEMS).

13. The method of claim 9, wherein the noise suppressed speech signal is generated at frequencies spanning from 0.001 kHz to 10 kHz.

14. The method of claim 9, wherein
cross-correlating comprises cross-correlating the primary speech signal with the accelerometer signal in the frequency domain.

15. The method of claim 9, wherein
cross-correlating comprises cross-correlating the primary speech signal received from primary microphone with the accelerometer signal in the time domain.

16. A non-transitory, tangible machine readable storage medium encoded with machine executable instructions, wherein execution of the machine executable instructions is for a mobile communication device to:
receive, at a primary microphone of the mobile communication device, speech and ambient noise;
generate, at the primary microphone, a primary speech signal based on the speech and the ambient noise that is received;
receive, at a secondary microphone, speech and ambient noise;
generate, at the secondary microphone, a secondary speech signal based on the speech and the ambient noise that is received;
detect, at an accelerometer of the mobile communication device, vibrations at the mobile communication device when the speech and the ambient noise are received at the microphone;
generate, at the accelerometer, an accelerometer signal corresponding to the vibrations that are detected;
cross-correlate, at the processor, the primary speech signal with the accelerometer signal;
identify, at the processor, regions in time where a strong cross-correlation exists between the primary speech signal and the accelerometer signal;
determine, at the processor, whether a level of the primary speech signal and a level of the secondary speech signal are the same;
when the level of the primary speech signal and a level of the secondary speech signal are the same, signal process, at the processor, using a noise suppression process, the accelerometer signal in the identified regions in time based on the secondary signal to generate a noise suppressed speech signal;
otherwise, signal process at the processor, using the noise suppression process, the primary speech signal based on the secondary speech signal to generate a noise suppressed speech signal.

* * * * *